United States Patent [19]

Ujiie

[11] Patent Number: 5,629,649

[45] Date of Patent: May 13, 1997

[54] FREQUENCY STANDARD GENERATOR SYNCHRONIZED WITH SATELLITE OR OTHER COMMUNICATION NETWORK REFERENCE CLOCKS

[75] Inventor: Hitoshi Ujiie, Sendai, Japan

[73] Assignee: Advantest Corporation, Tokyo, Japan

[21] Appl. No.: 562,106

[22] Filed: Nov. 22, 1995

[30] Foreign Application Priority Data

Nov. 24, 1994 [JP] Japan ...................................... 6-314192

[51] Int. Cl.$^6$ ...................................................... H03L 7/085
[52] U.S. Cl. ........................... 331/17; 331/18; 331/25; 331/44; 331/66; 331/69; 331/158; 375/376; 455/260; 455/51.1; 327/156
[58] Field of Search ............................... 331/1 A, 2, 14, 331/17, 18, 25, 44, 55, 66, 69, 70, 158, 175; 327/147–150, 156–159, 298, 299; 375/376; 455/259, 260, 265

[56] References Cited

U.S. PATENT DOCUMENTS

| | | | |
|---|---|---|---|
| 4,899,117 | 2/1990 | Vig | 331/44 X |
| 5,203,030 | 4/1993 | Kawasaki | 331/4 X |
| 5,311,149 | 5/1994 | Wagner et al. | 331/18 X |
| 5,363,112 | 11/1994 | Hatcher | 331/17 X |
| 5,392,005 | 2/1995 | Bortolini et al. | 331/44 |
| 5,477,195 | 12/1995 | Spilker | 331/17 X |
| 5,483,201 | 1/1996 | Bortolini | 331/44 X |

Primary Examiner—David Mis
Attorney, Agent, or Firm—Knobbe, Martens, Olson & Bear, LLP

[57] ABSTRACT

A frequency standard generator includes a voltage controlled crystal oscillator for generating high stability output signal to be used as a standard frequency signal, a satellite wave receiver which receives a radio wave from a satellite which includes a highly accurate satellite time signal and reproduces the satellite time signal to be used as a reference for the voltage controlled crystal oscillator, a frequency divider which divides the output signal of the voltage controlled crystal oscillator by a dividing ratio arranged to generate a crystal time signal which is identical in frequency to the satellite time signal, a time interval measuring circuit which measures a time interval which is a phase difference between the satellite time signal and the crystal time signal and generates a digital signal indicating the phase difference, a frequency control processor which arithmetically determines control data based on the digital signal from the time interval measuring circuit such that the phase difference maintains a constant value through an operation of a phase lock loop, and a D/A converter which converts the control data from the frequency control processor to an analog voltage which is used to control the output frequency of the voltage controlled crystal oscillator.

16 Claims, 5 Drawing Sheets

FIG. 3C  CLK

FIG. 3G  CLK

FREQUENCY STANDARD GENERATOR SYNCHRONIZED WITH SATELLITE OR OTHER COMMUNICATION NETWORK REFERENCE CLOCKS

BACKGROUND OF THE INVENTION

This invention relates to a frequency standard generator for easily generating a highly accurate and stabilized reference frequency which is common in all over the world, and more particularly, to a frequency standard generator for providing a high accuracy reference frequency at anytime and anywhere with low cost by receiving a high accuracy time signal from a satellite or a communication network having a high accuracy frequency standard such as an atomic frequency standard or an equivalent thereof.

A recent advanced communication system requires a higher resolution and accuracy clock signal uniformly used in communication networks and systems. In particular, a digital communication network, a data communication network including mobile communication networks and TV broadcasting networks, and an environmental observation network of global scale demand this high resolution clock signal. In the conventional information communication systems, such requirements have been carried out by various configurations as described below.

Generally, an atomic frequency standard is used as a primary standard and a high stability quartz-crystal oscillator is calibrated to the atomic frequency standard to function as a secondary standard. However, with the increase of information volume, the combination of the atomic standard and the quartz-crystal standard has become insufficient in terms of its frequency resolution since the quartz-crystal oscillator is used as a secondary standard. Thus, an atomic frequency standard, especially a rubidium atomic standard is used as a secondary standard to improve the frequency resolution.

In domestic communication networks, it is a common practice to use a frequency information of an upper level station having a higher frequency accuracy for a frequency standard of a lower level station. In one example, the frequency information from the upper level station is distributed to the lower level stations as a reference clock through exclusive lines so that clock signals in the lower level directly synchronize with the reference clock signal. In another example, the frequency information in the upper station is embedded in a data structure and distributed to the lower level stations through data lines, and then the lower level stations detect the reference clock components from the data to synchronize a lower level clock with the reference clock in the data.

In a TV broadcasting network, carrier signals are formed based on a highly stabilized oscillator provided in each broadcasting station. Usually, such a highly stabilized oscillator utilizes a high stability quartz-crystal oscillator housed in a temperature oven. However, regarding a color sub-carrier signal, since net stations must be dependent on key stations, the key stations must maintain a sufficiently high accuracy frequency reference. Therefore, the key stations install rubidium atomic standards to be calibrated to radio frequency signals provided by a standard organization of each country or a Loran C navigation radio wave to maintain the high accuracy.

A carrier signal from a TV broadcasting local station utilizes an offset carrier method in which frequencies of the carrier signals in a given channel are set to be slightly different from each other to obviate an interference within the channel as well as to improve an effective use of the frequency resources. At present, the frequency offset in the local station need not be very precise as required in the key station, and thus the reference clock for forming the offset carrier is not frequently calibrated. However, since a range of frequency allocation per channel is getting more and more smaller, in the near future, the local TV stations may employ a synchronous broadcasting method which requires a high accuracy reference clock.

In the synchronous broadcasting method, carrier signal frequencies between the stations which tend to cause interference problems are precisely synchronized with each other, which obviates the interference problems in the same channel. In this method, like the color sub-carrier, the carrier signals must be precisely synchronized between the stations. Feasibility of the synchronous broadcasting method is also discussed in a radio broadcasting system in which the frequency allocation is even more tighter than that of the TV broadcasting system, although any agreement for a measure of an accurate frequency generation has not reached so far.

For international communication systems, it is recommended by Technical Session of the International Telecommunications Union (ITU/TS) that the reference frequency of each country keep the short term accuracy of $10^{-9}$ and the long term accuracy of $10^{-11}$ with respect to Universal Co-ordinate Time (UTC) which is provided by the International Bureau of Weights and Measures (BIPM). To meet this recommendation, each country installs a cesium atomic frequency standard as a high stability frequency source and, as a means for UTC transfer, utilizes the standard radio waves provided by various countries or Loran C navigation waves. These radio waves are always accurately synchronized with the UTC, and if there exists a frequency offset therebetween, such a frequency offset will be publicly announced.

In a natural and environmental observation network, it is necessary to observe the environmental information throughout the earth, which requires a precise synchronization among the frequencies of oscillators in the observation stations in many places. To satisfy this requirement, a frequency deviation with respect to UTC is constantly monitored by using an available standard such as a standard radio wave.

Recently, the United States Department of Defense has launched a high resolution positioning system called a Global Positioning System (GPS) involving artificial satellites. Each GPS satellite installs a cesium atomic oscillator whose frequency is managed and calibrated by the Department of Defense. The GPS satellite transmits information concerning its position and an accurate time clock, i.e., a GPS time signal. A phase per second in the GPS time signal is synchronized within one microsecond ($10^{-6}$) with respect to the UTC. Further, since a phase offset for a time length which is more than one second is known, it is easy to convert the GPS time to UTC.

Since 1993, United States Department of Defense and United States Department of Transportation opened C/A (Coarse/Acquisition) codes of the GPS satellite to private use. Further, the United States government is planning to further improve the positional resolution of this system. At present, twenty six (26) GPS satellites are running around the earth and thus, at least three or four satellites are always accessible from anywhere on the earth.

At present, a frequency standard generator is available in which the GPS time signal is utilized as a primary standard. However, in such a frequency standard generator, a rubidium atomic standard is synchronized with the GPS time signal. Thus, in this device, the rubidium atomic standard is used as a secondary oscillator like the key stations of the TV networks as noted above.

The foregoing conventional frequency standard systems involve disadvantages as described below. Although the system using the atomic frequency standard is a highly accurate frequency standard, it has a disadvantage that it involves a high cost. Not only the system itself is expensive but maintaining the system also requires a high cost since regular replacements of lamps and gas cells are necessary in the system.

In the wire communication network, exclusive lines for sending frequency references must be constructed in addition to the data lines. In case where only the data lines are provided, a source station of a reference frequency has to transform the waveform of the reference in the data and a receiving end has to extract the reference frequency from the data, which degrades the accuracy of the reference frequency. Furthermore, since the wire communication network involves many layers of communication lines and thus the overall communication lines tend to be very lengthy, the synchronization of the clock signals are subject to phase jitters and wanders caused by environments surrounding such communication lines.

The TV broadcasting networks and the international communication networks require a monitoring system to monitor frequency deviations between the standard radio waves and the UTC. These networks further need constant calibration works to maintain the accuracy level of the standard frequency. The synchronized broadcasting systems also need such monitoring systems and regular calibration works in the local stations by using standard radio waves or other frequency standards. The environmental observation systems also require constant calibration works and the like.

As has been in the foregoing, the conventional systems involve various problems including the degradation of synchronization in the layers of communication lines, the needs of the monitoring system of the frequency deviations with respect to the UTC, the needs of the constant calibrations with respect to the UTC, and the needs of the high cost atomic frequency standard which further requires regular maintenance works. Therefore, there is a need to provide a new frequency standard generator which can solve the problems associated with the conventional frequency standard systems.

SUMMARY OF THE INVENTION

Therefore, it is an object of the present invention to provide a frequency standard generator which is capable of generating a highly accurate reference frequency at anytime and anywhere with low cost.

It is a further object of the present invention to provide a frequency standard generator which is capable of synchronizing with a time signal from a GPS (Global Positioning System).

It is another object of the present invention to provide a frequency standard generator which is capable of generating a high accuracy reference frequency which is not affected by a sudden change of the GPS time signal.

It is a further object of the present invention to provide a frequency standard generator which is capable of controlling an internal quartz-crystal oscillator to be synchronized with the GPS time.

It is a further object of the present invention to provide a frequency standard generator which is capable of obtaining average phase data showing a long range phase difference between the GPS time and the reference clock time of the internal crystal oscillator to feedback control the internal crystal oscillator.

It is a further object of the present invention to provide a frequency standard generator which is capable of dynamically changing parameters of a phase lock loop for determining a response characteristics of the phase lock loop depending on the degree of a phase difference and a requirement of locking time.

It is a further object of the present invention to provide a frequency standard generator which is capable of minimizing maintenance needs.

It is a further object of the present invention to provide a frequency standard generator which is capable of accurately synchronizing the quartz-crystal oscillator with the GPS time within a short period of time by dynamically changing mathematical parameters of the feedback loop.

The frequency standard generator of the present invention has a voltage controlled quartz-crystal oscillator which is phase locked to a GPS (Global Positioning System) satellite time signal. The standard generator receives the radio waves from the GPS satellite to reproduce a high accuracy time signal in the radio waves. The time signal in the radio wave is originated by an ultra-high accuracy atomic frequency standard installed in the GPS satellite which may also be linked to a UTC (Universal Co-ordinate Time). The frequency standard generator of the present invention synchronizes the quartz-crystal oscillator with the time signal on the basis of average phase data showing a long time phase difference between the GPS time signal and the reference clock time of the quartz-crystal oscillator through a phase lock loop (negative feedback loop).

In addition to the GPS satellite, the frequency standard of the present invention can also use other positioning systems such as GLONASS (Global Navigation Satellite System) launched by the former Soviet Union. The present invention can also use a future satellite so long as it generates an accurate time information. Further, the standard frequency generator of the present invention can use secondary frequency references provided in the communication systems which are produced based on the satellite time information.

The frequency standard generator of the present invention includes a voltage controlled crystal oscillator for generating high stability output signal to be used as a standard frequency signal, a satellite wave receiver which receives a radio wave from a satellite which includes a highly accurate satellite time signal and reproduces the satellite time signal to be used as a reference for the voltage controlled crystal oscillator, a frequency divider which divides the output signal of the voltage controlled crystal oscillator by a dividing ratio arranged to generate a crystal time signal which is identical in frequency to the satellite time signal, a time interval measuring circuit which measures a time interval which is a phase difference between the satellite time signal and the crystal time signal and generates a digital signal indicating the phase difference, a frequency control processor which arithmetically determines control data based on the digital signal from the time interval measuring circuit such that the phase difference maintains a constant value by a phase lock loop, and a D/A converter which converts the control data from the frequency control processor to an analog voltage which is used to control the output frequency of the voltage controlled crystal oscillator.

According to the present invention, the frequency standard generator is capable of generating a highly accurate reference frequency at anytime and anywhere, since it is not required to trace its frequency accuracy to an atomic frequency standard. The frequency standard generator utilizes the satellite time signal from the GPS (Global Positioning System) satellite which is available anywhere on the earth.

The frequency standard generator dynamically changes parameters of a phase lock loop for determining a response characteristics of the phase lock loop depending on the degree of a phase difference and a requirement of locking time. The frequency standard generator of the present invention is capable of obtaining average phase data showing a long range phase difference between the GPS time and the internal crystal oscillator to feedback control the internal crystal oscillator, i.e., the time constant for the phase lock loop is very large.

Since the time constant of the phase lock loop is extremely large, i.e., the loop band width is extremely small when the standard is in the complete phase lock, the output frequency of the frequency standard generator of the present invention maintains its accuracy even when the satellite time signal is not given for a certain period of time by an unexpected trouble. In addition, since the loop band width is extremely small, even there is a phase jitter in the satellite time signal because of radio wave transmission problems, the reference frequency of the standard generator is not affected by the jitter.

Further, the frequency standard generator of the present invention utilizes a voltage controlled quartz-crystal oscillator which is controlled to be synchronized with the GPS time. Thus, unlike the frequency standard using an atomic standard oscillator, the frequency standard generator of the present invention is low cost and maintenance free.

Furthermore, the frequency standard generator which is capable of accurately synchronizing the quartz-crystal oscillator with the GPS time within a short period of time by dynamically changing phase lock parameters of the feedback loop by a mathematical process. The high frequency stability of the frequency standard generator is also supported by the capability of dynamic compensation of the temperature change surrounding the crystal oscillator.

DETAILED DESCRIPTION OF THE PREFERRED EMBODIMENT

Figure 1:
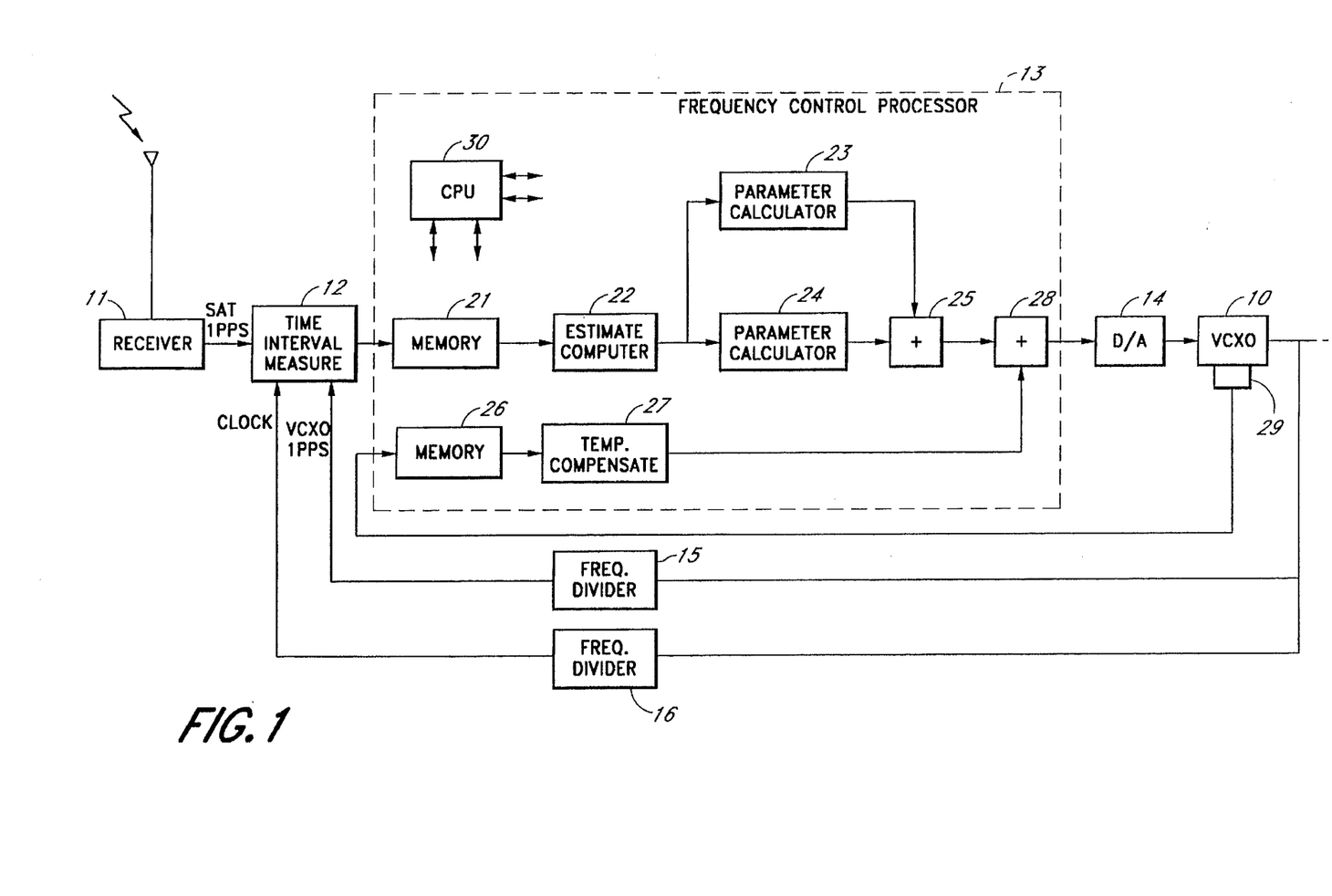
FIG. 1 is a block diagram showing a configuration of a first embodiment of the frequency standard generator of the present invention.

FIG. 1 shows a first embodiment of the frequency standard generator in accordance with the present invention. The frequency standard generator of FIG. 1 includes a voltage controlled crystal oscillator (VCXO) 10, a temperature sensor 29 attached to the crystal oscillator 10, a satellite wave receiver 11, a time interval measuring circuit 12, a frequency control processor 13, a D/A (digital to analog) converter, a frequency divider 15 and a frequency converter 16. The frequency control processor 13 includes a computer (CPU) 30, buffer memories 21 and 26, an estimation computing circuit 22, parameter calculators 23 and 24, adders 25 and 28 and a temperature compensation part 27. The output of the crystal oscillator 10 is used as a standard frequency signal.

Simply stated, the frequency standard generator of FIG. 1 forms a phase lock loop wherein the output phase of the voltage controlled crystal oscillator 10 is phase locked to the GPS time signal from the GPS satellite. The output frequency of the crystal oscillator 10 is feedbacked to be compared with the GPS time signal, and the resultant comparison signal forms a control signal to perfectly lock the phase of the crystal oscillator output to the satellite time signal. In the present invention, phase lock loop parameters dynamically change depending on the frequency pull-in situations.

The voltage controlled crystal oscillator 10 of FIG. 1 includes a quartz-crystal oscillator which has an aging rate of $5 \times 10^{-10}$/ day and a variable frequency range ($\Delta f/f$) of $2 \times 10^{-7}$. The quartz-crystal oscillator is provided in a constant temperature oven. The temperature of the oven is monitored by the temperature sensor 29 to feedback control the crystal oscillator 10 so as to cancel the frequency change caused by the temperature change.

The satellite wave receiver 11 receives the radio wave from a GPS (Global Positioning System) satellite and reproduces a time signal in the radio wave. Typically, the time signal from the GPS satellite is a 1 pps (one pulse per second) signal which is modulated by a carrier signal of the radio wave. When the time signal of less than 1 pps, i.e., 0.5 pps or 0.1 pps is provided in the future, the satellite wave receiver 11 of the present invention can be modified accordingly. At present, since at least 3 or 4 GPS satellites are available at anywhere on the earth, a UTC (Universal Co-ordinate Time) time is also available by demodulating the three or more time signals from the GPS satellites. The satellite wave receiver 11 of the present invention can be replaced with a satellite signal receiver used in an automobile navigation system.

The time interval measuring circuit 12 measures the time interval of the 1 pps satellite time signal 1 pps from the satellite wave receiver 11 and a 1 pps crystal time signal from the voltage controlled crystal oscillator 10 to compare the phase difference between the two. Namely, the time interval measuring circuit 12 functions as a phase comparator for the phase lock loop. The time interval measuring circuit 12 measures the time interval (phase difference) with higher resolution than a smallest time period of a clock signal used by using an interpolation technic. The more detail of the time interval measuring circuit 12 will be provided later with reference to FIG. 2.

The frequency control processor 13 receives the phase comparison data from the time interval measuring circuit 12 and produces various phase lock parameters which determines a response characteristics of the phase lock loop. As is well known in the art, a loop response curve in a phase lock loop will be determined by a loop gain and a loop bandwidth. Such loop parameters are expressed in the present invention as a proportional constant and an integration constant.

The frequency control processor 13 dynamically determines the integration constant by the parameter calculator 23 and the proportional constant by the parameter calculator 24 based on a deviation of the phase difference between the satellite time signal and the crystal time signal. The more detail of the frequency control processor 13 will be provided later.

The D/A converter receives a phase control signal from the frequency control processor 13 and converts the phase control signal to an analog voltage which is supplied to the voltage controlled crystal oscillator 10. The output of the crystal oscillator 10 is feedbacked to the time interval measuring circuit 12 through the divider 15. The dividing ratio of the divider 15 is determined to produce a 1 pps pulse rate from the output of crystal oscillator 10 to be supplied to the time interval measuring circuit 12.

In this example, the output of the crystal oscillator 10 is also used as a clock signal for the time interval measuring circuit 12 through the frequency converter 16 which typically a frequency multiplier to form a clock signal whose frequency is high enough to obtain a necessary resolution with respect to the time interval to be measured.

Figure 2:
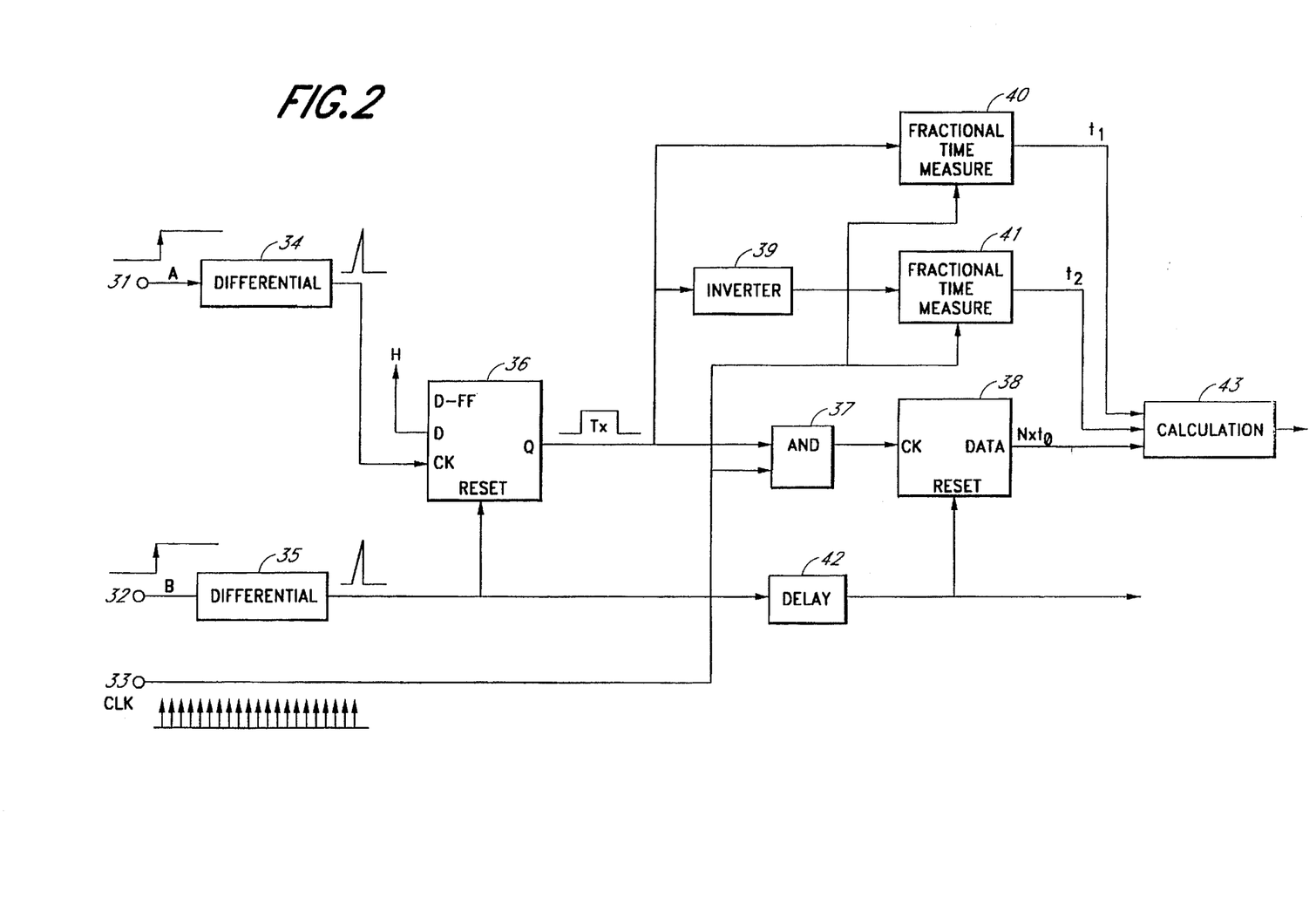
FIG. 2 is a block diagram showing an example of circuit configuration of the time interval measuring circuit 12 in the embodiment of FIG. 1.

FIG. 2 shows a block diagram of the time interval measuring circuit 12 which measures the time interval of the 1 pps satellite time signal detected by the satellite wave receiver 11 and the 1 pps crystal time signal from the voltage controlled crystal oscillator 10. As noted above, the time interval measuring circuit 12 functions as a phase comparator for the phase lock loop by comparing the phase difference between the satellite time signal and the crystal time signal from the crystal oscillator 10.

The time interval measuring circuit 12 includes differential circuits 34 and 35, a D-type flip-flop 36, an inverter 39, fractional time measuring circuits 40 and 41, an AND gate 37, a counter 38, a delay circuit 42 and a calculation circuit 43. An input terminal 31 is provided with a 1 pps satellite time signal A from the satellite wave receiver 11 and an input terminal 32 is provided with a 1 pps crystal time signal B from the crystal oscillator 10. A clock terminal 33 is provided with a clock signal CLK which is, in this example, a multiplied frequency signal of the output of the crystal oscillator 10 through the frequency converter 16 of FIG. 1.

Rising edges of the satellite time signal A and the crystal time signal B are taken by the differential circuits 34 and 35, respectively. The edge signals from the differential circuits 34 and 35 are provided to the D-type flip-flop 36. In this example, the edge signal from the differential circuit 34 is applied to a clock terminal CK of the D-type flip-flop 36 to change its output Q to a high level. The edge signal from the differential circuit 35 is applied to a reset terminal of the D-type flip-flop 36 to change the output Q to a low level.

A resulted pulse width Tx at the output Q is a phase difference, i.e., a time interval between the satellite time signal and the crystal time signal of the voltage controlled crystal oscillator. This invention is to control the oscillation frequency of the voltage controlled crystal oscillator 10 so that an average value of this time interval Tx is always constant with high stability.

The fractional time measuring circuits 40 and 41 and the counter 38 are provided with the time interval Tx to measure the pulse width with high resolution using the clock signal CLK from the terminal 33. In this example, the clock signal CLK is formed by the frequency converter 16 of FIG. 1 which multiplies the output frequency of the voltage controlled crystal oscillator 10. However, any clock signal is applicable to this invention if such a clock signal has a high enough frequency with a high accuracy and stability to obtain a sufficient measurement resolution. For example, a clock signal from a separate quartz-crystal oscillator or a highly accurate computer clock signal can also be used in this invention.

The counter 38 counts the number of clock pulses within the time interval Tx. Since the clock signal CLK is not in synchronism with the satellite time signal A or the crystal time signal B, there are timing differences (fractional times) between the clock signal and the rising edge or the falling edge of the time interval Tx. Such fractional times are measured by the fractional time measuring circuits 40 and 41 which include an interpolation technic. As is known in the art, typical example of the interpolation technic includes a dual-slope integrator or a double integrator which proportionably expands a fractional time to a certain degree which is long enough to improve the resolution of time interval measurement.

Based on the measurement results of the fractional time measuring circuits 40 and 41 and the counter 38, the time interval Tx which indicates the timing difference between the satellite time signal A and the crystal time signal B is calculated as $Tx=N \times t_0+t_1-t_2$, where N is a number of clock signal counted by the counter 38, $t_0$ is a time period of the clock signal CLK, $t_1$ is a former edge fractional time and $t_2$ is a later edge fractional time. This calculation is performed by the calculation circuit 43 the output of which is connected to the frequency control processor 13.

FIG. 3 is a timing chart showing an operation of the time interval measuring apparatus of FIG. 2. FIG. 3(a) shows a rise timing of the satellite time signal A from the input terminal 31 and FIG. 3(b) shows a rise timing of the crystal time signal B from the input terminal 32. FIG. 3(c) is a clock signal CLK having a time period $t_0$. If there is no interpolation technic used, the available maximum resolution for the time interval measurement is limited to the time period $t_0$. FIG. 3(d) shows a former edge fractional time $t_1$ which is measured by the fractional time measuring circuit 40. FIG. 3(e) shows a later edge fractional time $t_2$ which is measured by the fractional time measuring circuit 41.

Figure 3A:
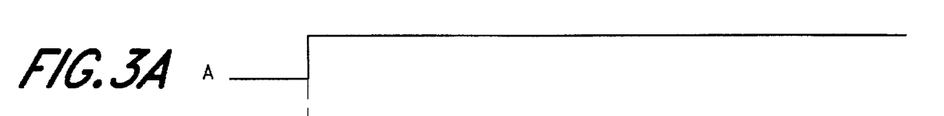
FIG. 3 is a timing chart showing an operation of the time interval measuring circuit of FIG. 2.
Figure 3B:
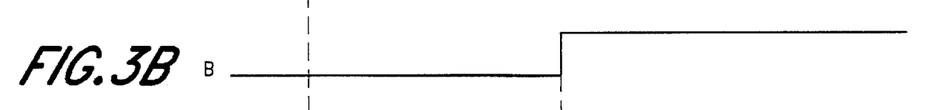
Figure 3C:
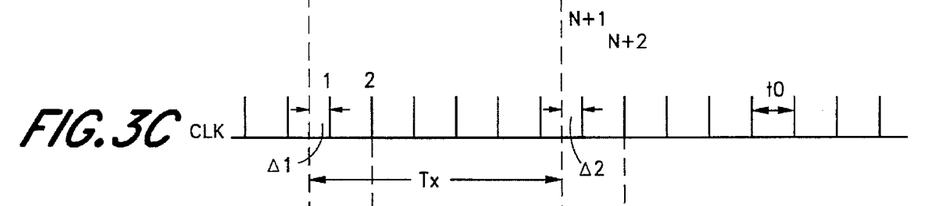
Figure 3D:
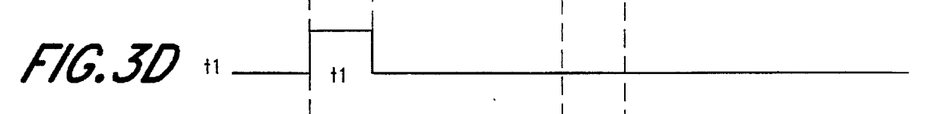
Figure 3E:
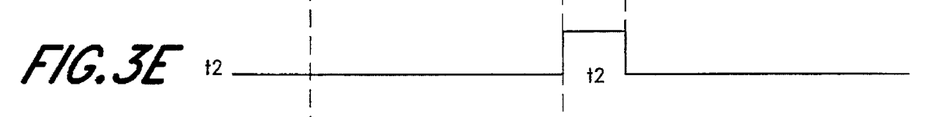

The actual former edge fractional time is a time difference $\Delta 1$ of FIG. 3(c) between the edge of FIG. 3(a) and the clock signal coming immediately thereafter. Similarly, the actual later edge fractional time is a time difference $\Delta 2$ of FIG. 3(c) between the rise timing of FIG. 3(b) and the clock signal coming immediately thereafter. However, since such fractional time may be too small for integrators, for example, in the fractional time measuring circuits 40 and 41 to perform an interpolation operation, each of the fractional times $t_1$ and $t_2$ in this example is added with the clock time period $t_0$. Namely, the fractional times $t_1=\Delta 1+t_0$, and $t_2=\Delta 2+t_0$.

Figure 3F:
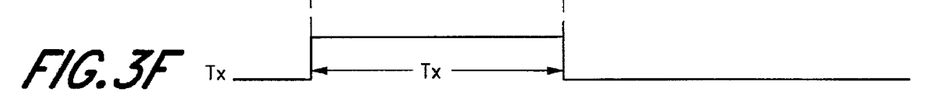
Figure 3G:
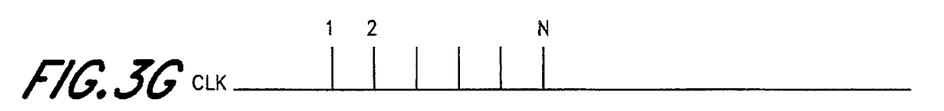

FIG. 3(f) shows a time interval Tx to be measured by the time interval measuring circuit 12. The counter 38 counts the number of clock pulses shown in FIG. 3(g) coming during the time interval Tx. As noted above, the time interval $Tx=N \times t_0+t_1-t_2$, where $t_0$ is a time period of the clock signal. However, since the resolution of the counter 38 is limited to the time period $t_0$ of the clock signal CLK, the fractional times $t_1$ and $t_2$ are obtained to be measured by the fractional time measuring circuits 40 and 41 as described above.

The calculation circuit 43 calculates the time interval Tx with high resolution based on the measured data from the counter 38, the fractional time measuring circuits 40 and 41. The data from the counter 38 indicates the number of clock pulses while the data from the fractional time measuring circuits 40 and 41 includes information which is smaller than the time period of the clock signal CLK. For example, in a preferred embodiment, the time interval Tx is calculated with a resolution of 100 picosecond ($100 \times 10^{-12}$) when the clock signal resolution is 10 nanosecond.

Referring back to FIG. 1, the frequency control processor 13 is mainly formed of the computer (CPU) 30. The buffer memory 21 stores the measured data from the time interval measuring circuit 12. In a preferred embodiment, the buffer memory 21 is formed with a recycle memory of ring shape having a more than 256 data capacity.

The estimation computing circuit 22 takes out the current data from buffer memory 21 and performs an estimation computing process based, for example, on a moving average method. If necessary, the estimation computing circuit 22 reads out the old data for performing the estimation computing process. Here, the estimation computing is an arithmetic process to estimate the next control voltage for the voltage controlled crystal oscillator based on the data showing the past frequency deviation.

Since the satellite time signal at present is a one-pulse per second (1 pps) signal, the repetition rate of which is too low to effectively control the crystal oscillator with high speed. Thus, it is preferable to divide the one second period into 10 or 1000 so that the control signals are generated every one millisecond or hundred millisecond. Thus, the estimation computing circuit 22 performing its computing process, for example, 1000 times per second. In addition to the moving average method, a least square method or a spline interpolation method can also be used for the estimation process.

In the estimation computing circuit 22, a deviation $DF_p$ between the moving average of the previous time interval measurement data and the moving average of the current time interval measurement data is obtained first. The frequency control processor 13 of the present invention is to dynamically change the number of data and the phase lock loop parameters, i.e., a proportionate constant and a integration constant to eliminate this deviation as fast as possible. As is known in the art, such parameters determine the loop response characteristics of the phase lock loop.

For example, when the deviation $DF_p$ is greater than the predetermined value, the frequency control processor 13 sets a first control mode in which it controls the phase lock loop to increase the response speed by decreasing the number of data used for moving averaging process. In this situation, the frequency control processor 13 also increases the proportional constant and decreases the integration constant so that a frequency pull-in time of the loop becomes small. The phase lock loop under these parameters has a larger bandwidth which promotes a frequency pull-in at high speed while the phase synchronization accuracy will be low.

When the frequency pull-in is progressed to a certain degree, and thus, the deviation $DF_p$ becomes smaller, the frequency control processor 13 sets the next control mode in which the number of data for the moving average computation is increased, the proportional constant is decreased while the integration constant is increased. Like this manner, by changing the control modes step by step, the phase lock loop is controlled to accomplish an optimum response characteristics.

Table 1 shows an example of parameters when the frequency control processor 13 employs seven steps of control modes. In Table 1, $DF_p$ represents a deviation of the data measured by the time interval measuring circuit 12, P is a proportional constant of the phase lock loop, I is an integration constant of the phase lock loop and N represents the number of data to be averaged for the moving average computation process.

TABLE 1

| CONTROL MODE | $DF_p$ | P | I | LOOP STATE | N |
|---|---|---|---|---|---|
| mode 1 | $DF_p > 800$ | 8 | $2^{-22}$ | pull-in | 4 |
| mode 2 | $800 \geq DF_p > 600$ | 7 | $2^{-20}$ | | 8 |
| mode 3 | $600 \geq DF_p > 400$ | 6 | $2^{-18}$ | | 16 |
| mode 4 | $400 \geq DF_p > 200$ | 4 | $2^{-16}$ | | 32 |
| mode 5 | $200 \geq DF_p > 100$ | 3 | $2^{-14}$ | | 64 |
| mode 6 | $100 \geq DF_p > 50$ | 2 | $2^{-12}$ | | 128 |
| mode 7 | $50 \geq DF_p$ | 1 | $2^{-10}$ | complete sync | 256 |

In the example of Table 1, when the deviation $DF_p$ of the time interval measurement data is greater than 800, a control mode 1 is set wherein the number of data for the moving average is 4, the proportionate constant P is 8 and the integration constant I is $2^{-22}$. As shown in Table 1, the upper the control mode, the more the number of data to be moving averaged, the lower the value of the proportionate constant P, and the greater the integration constant I.

When the deviation $DF_p$ is smaller than 800, the control mode is set to the appropriate mode number based on the value of the deviation. Such a change of control mode may be determined by, for example, number of times of $DF_p$ meets the condition in the table. For example, the control mode shifts to an upper mode when the $DF_p$ satisfies the condition in a certain range only once while the control mode shifts to a lower mode when the $DF_p$ satisfies the condition in a certain range more than twice.

As noted above, the deviation $DF_p$ is a difference between the previous moving average and the present moving average of the time interval measurement data. Since the time signal is typically a 1 pps (one-pulse per second) signal, the deviation data $DF_p$ is produced only by every one second. The frequency control voltage for the voltage controlled crystal oscillator 10 is a multiplier of the deviation $DF_p$, the proportionate constant P and the integration constant I. Thus, the control voltage produced based on the deviation $DF_p$ per second may include voltage changes which is too large for precisely controlling the frequency of the crystal oscillator 10.

Therefore, the estimation computation circuit 22 divide this one second time period into 10 or 1000, for example to produce smaller step control data to control the voltage controlled crystal oscillator 10 with higher resolution. As an example, the estimation computation circuit 22 generates control data at every 1/10 second, i.e., 100 ms. At first, by using the most recent deviation $DF_p$/second, the next 10 deviation data $DF_{p+0.1}$–$DF_{p+0.9}$ are estimated by, for example, a linear approximation method, to be $DF_p$/ 10. Namely, if the deviation $DF_p$ for one second is 1000, then each deviation for every 1/10 second in this case is $DF_{p+0.1n} = 100$.

The parameter calculation circuit 24 multiplies the proportional constant P which is determined by the Table 1 with the estimated deviation $DF_{p+0.1n}$, and thus, the proportional value in the loop is $DF_{p+0.1n} \times P$. The parameter calculation circuit 23 multiplies the integration constant I which is determined by Table 1 with the estimated deviation $DF_{p+0.1n}$. An integration process is performed by the parameter circuit 23 for $INTG_n = (DF_{p+0.1n} \times I) + INTG_{old}$, where $INTG_n$ designates a present integration value and $INTG_{old}$ designates a previous integration value. The present integration will be used as an old integration value for performing the next 1/10 second integration.

The proportional value and the integration value are added by the adder 25 to produce a control signal for voltage controlled crystal oscillator 10. This process is repeated at every 100 ms based on the value shown in Table 1. At the later stage of this control process, the frequency of the voltage controlled oscillator 10 shifts to the complete synchronous state from the frequency pull-in state, i.e., the mode 7 of Table 1. In this mode, the number of data used for the moving average computation is 256, the proportional constant is 1 and the integration constant is $2^{-10}$ wherein there will be almost no change in the frequency control voltage for the crystal oscillator. Thus, the average time interval data shows a long range phase difference between the GPS time signal and the crystal time signal to feedback control the internal crystal oscillator.

In this situation of the complete synchronization, the phase lock loop has an extremely narrow frequency band, i.e., a cut off frequency of an equivalent loop filter of the phase lock loop is very low. Therefore, jitters and fluctuations in a radio wave or a communication line are effectively suppressed. Further, since the loop frequency is extremely low or a time constant of the phase lock loop is extremely large, the output frequency of the frequency standard generator of the present invention maintains its accuracy even when the satellite time signal is not given for a certain period of time by an unexpected accident or the like.

When the frequency standard generator of the present invention starts without any previous use, the phase lock loop starts operation by the parameters of the control mode 1. In case where the frequency standard generator is used at a relatively short time after the previous use, the phase lock loop starts with the parameters of the previous use which are then compared with the present value of the loop to determine the mode in Table 1. This process will usually shorten the time for the phase lock loop to come to the complete synchronization stage of the mode 7.

In the example of FIG. 1, the frequency control processor 13 incudes a temperature compensation part 27 which is connected to the phase lock loop. The temperature compensation part 27 generates a temperature compensation voltage to compensate the temperature change in the voltage controlled crystal oscillator 10 detected by the temperature sensor 29 whose date is stored in the buffer memory 26. The compensation voltage is supplied to the adder 28 where it is combined with the frequency control voltage from the adder 25 formed by the above noted process.

The overall control voltage from the adder 28 is supplied to the voltage controlled crystal oscillator 10 through the D/A converter 14. In the present invention, the buffer memory 26 and the temperature compensation part 27 need not be in the frequency control processor 13, but can be provided in other manners, such as inside of the voltage controlled crystal oscillator 10.

Figure 4:
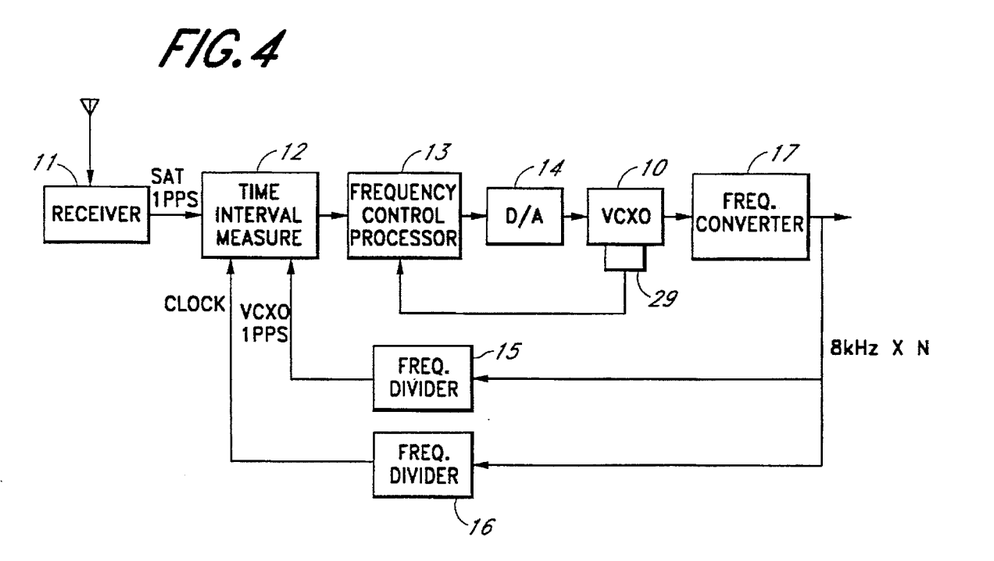
FIG. 4 is a block diagram showing a configuration of a second embodiment of the frequency standard generator of the present invention.

FIG. 4 shows a second embodiment of the present invention. In FIG. 4, the same reference numeral as used in FIG. 1 designates the corresponding component of the embodiment of FIG. 1. The second embodiment shows a structure of the frequency standard generator suitable for use in a communication network application. In general, an oscillation frequency of the voltage controlled crystal oscillator 10 is limited to 1 MHz, 5 MHz or 10 MHz. However, in the communication network field, reference frequencies of 64 KHz, 1544 KHz, or 155.52 MHz, which are multiples of 8 KHz are widely used.

Therefore, in this invention, when the frequency standard generator is used to provide a reference frequency to a communication network, a frequency converter 17 is connected at the output of the voltage controlled crystal oscillator 10 to convert the crystal oscillator frequency to form a reference frequency suitable to such a communication network. The reference frequency is feedbacked to the time interval measuring circuit 12 through the divider 15 which divide the reference frequency to form a 1 pps time signal which is comparable with the satellite time signal. Since the divider ratio is smaller than that of FIG. 1, the output frequency of the standard generator of this example has a better quality, for example, less phase noise, than that of the FIG. 1.

Figure 5:
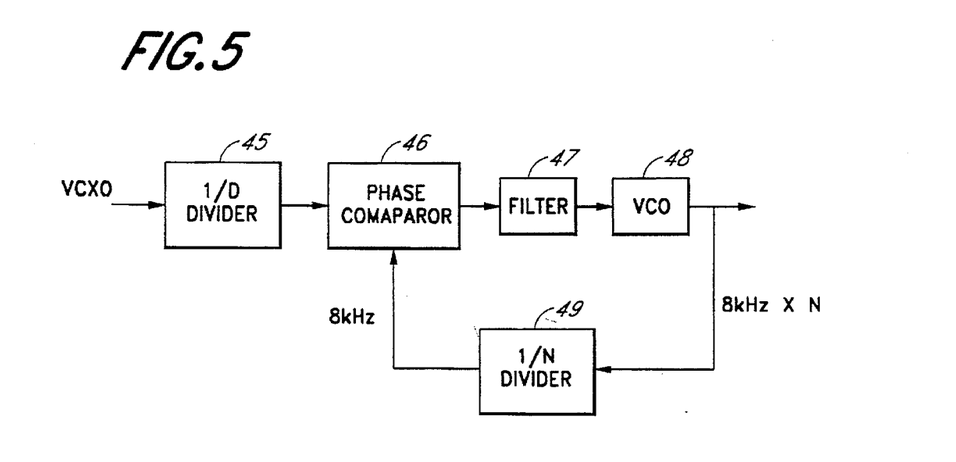
FIG. 5 is a block diagram showing a circuit configuration of a frequency convertor in the second embodiment of FIG. 4.

FIG. 5 shows an example of frequency converter 17 of FIG. 4. The frequency converter of FIG. 5 includes a divider 45, a phase comparator 46, a loop filter 47, a voltage controlled oscillator 48 and a divider 49. Basically, this is a typical phase lock loop similar to the circuit configuration of FIGS. 1 and 4. The divider 45 receives an output frequency of the voltage controlled crystal oscillator 10 to divide the frequency by D to form a 8 KHz output signal. An output frequency of the voltage controlled oscillator 48 which is an N multiple of 8 KHz as noted above is divided by N by the divider 49 to form a 8 KHz output signal.

Both 8 KHz output signals are compared in phase by the phase comparator 46 which generates a control voltage proportional to the phase difference between the two signals. The control voltage passes through the loop filter 47 to control the frequency of the voltage controlled oscillator 48 so that the phase of the oscillator 48 is locked to the output of the crystal oscillator 10. As is well known in the art, the response curve of the loop filter 47 determines a phase lock loop response characteristics. The loop filter 47 may include an amplifier to increase a loop gain of the phase lock loop. In this configuration of FIG. 5, the voltage controlled oscillator 48 generates a highly accurate reference frequency which is N/D of the frequency of the crystal oscillator 10 which meets the needs of the communication network.

Figure 6:
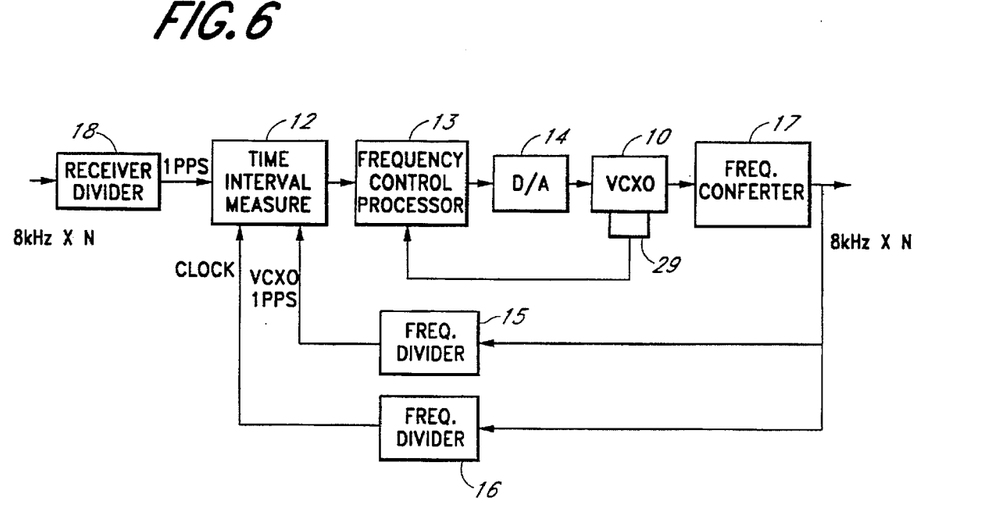
FIG. 6 is a block diagram showing a configuration of a third embodiment of the frequency standard generator of the present invention.

FIG. 6 shows an another embodiment of the present invention. Only the difference of FIG. 6 from FIG. 4 is that the example of FIG. 6 has a receiver divider 18 instead of the satellite wave receiver 11 of FIG. 4. The receiver divider 18 receives a clock signal from a commutation network and divide the clock signal to form a 1 pps time signal. The structure and operation of the other part of the circuit of FIG. 6 are substantially the same as those of FIGS. 1 and 4.

According to the present invention, the reference frequency of the voltage controlled crystal oscillator 10 is synchronized with the satellite time signal with $3.05 \times 10^{-11}$ accuracy. After a long time period of power off, the output frequency of the voltage controlled oscillator reaches within $2.4 \times 10^{-11}$ frequency accuracy in around 18 minutes. The response time of the phase lock loop when the voltage controlled crystal oscillator is in the complete synchronization is about 2.3 hours. This is because, in the complete synchronization, the phase lock loop has an extremely narrow frequency bandwidth, i.e., a cut off frequency of an equivalent loop filter of the phase lock loop is very low.

Therefore, even there is a phase jitter in the satellite time signal because of radio wave transmission problems, the reference frequency of the standard generator is not affected by the jitter. Further, since the loop frequency is extremely low, i.e., a time constant of the phase lock loop is extremely large, the output frequency of the frequency standard generator of the present invention maintains its accuracy even when the satellite time signal is not given for a certain period of time by an unexpected trouble. For example, when the 1 pps satellite time signal is not provided after the complete synchronization, it takes 2.4 days for the output phase of the standard generator shifts by 125 microsecond which is a basic frame length of a typical communication system. The high frequency stability of the frequency standard generator is also supported by the capability of dynamic compensation of the temperature change surrounding the crystal oscillator.

According to the resent invention, the frequency standard generator of the present invention is capable of generating a highly accurate reference frequency at anytime and anywhere, since it is not required to trace its frequency accuracy to an atomic frequency standard. The frequency standard generator utilizes the satellite time signal from the GPS (Global Positioning System) satellite which is available anywhere on the earth.

The frequency standard generator dynamically changes parameters of a phase lock loop for determining a response characteristics of the phase lock loop depending on the degree of a deviation of phase difference and a requirement of locking time. The frequency standard generator of the present invention is capable of obtaining average phase data showing a long range phase difference between the GPS time and the internal crystal oscillator to feedback control the internal crystal oscillator, i.e., the time constant for the phase lock loop is very large when the phase lock loop is in a complete synchronization.

Since the time constant of the phase lock loop is extremely large, i.e., the loop band width is extremely small when the frequency standard generator is in the complete phase lock, the output frequency of the frequency standard generator of the present invention maintains its accuracy even when the satellite time signal is not given for a certain period of time by an unexpected trouble. In addition, since the loop band width is extremely small, even there is a phase jitter in the satellite time signal because of radio wave transmission problems, the reference frequency of the standard generator is not affected by the jitter.

Further, the frequency standard generator of the present invention utilizes a voltage controlled quartz-crystal oscillator which is controlled to be synchronized with the GPS time. Thus, unlike the frequency standard using an atomic standard oscillator, the frequency standard generator of the present invention is low cost and maintenance free.

Furthermore, the frequency standard generator which is capable of accurately synchronizing the quartz-crystal oscillator with the GPS time within a short period of time by dynamically changing phase lock parameters of the feedback loop by a mathematical process. The high frequency stability of the frequency standard generator is also supported by the capability of dynamic compensation of the temperature change surrounding the crystal oscillator.

What is claimed is:

1. A frequency standard generator for generating an high accuracy reference frequency signal, comprising:

a voltage controlled crystal oscillator for generating high stability output signal to be used as a standard frequency signal;

a satellite wave receiver which receives a radio wave from a satellite which includes a highly accurate satellite time signal and reproduces said satellite time signal to be used as a reference for said voltage controlled crystal oscillator;

a frequency divider which divides said output signal of said voltage controlled crystal oscillator by a dividing ratio arranged to generate a crystal time signal which is identical in frequency to said satellite time signal;

a time interval measuring circuit which measures a time interval which is a phase difference between said satellite time signal and said crystal time signal and generates a digital signal indicating said phase difference;

a frequency control processor which arithmetically determines control data based on said digital signal from said time interval measuring circuit such that said phase difference maintains a constant value by a phase lock loop; and a D/A converter which converts said control data from said frequency control processor to an analog voltage which is used to control the output frequency of said voltage controlled crystal oscillator.

2. A frequency standard generator as defined in claim 1, wherein said time interval measuring circuit receives said satellite time signal and said crystal time signal and measures said time interval therebetween by a counter which is provided with a clock signal.

3. A frequency standard generator as defined in claim 1, wherein said time interval measuring circuit includes:

a counter which counts clock pulses of a clock signal provided thereto during a pulse width indicating said time interval;

a first fractional time measuring circuit which measures a fractional time between a rising edge of said pulse width and a clock pulse coming immediately after said rising edge;

a second fractional time measuring circuit which measures a fractional time between a falling edge of said pulse width and a clock pulse coming immediately after said falling edge.

4. A frequency standard generator as defined in claim 3, wherein said first and second fractional time measuring circuit include an interpolator which has an integrator to proportionably expand a fractional time to a signal large enough for said clock signal to count its time length, said fractional time being smaller than a period of said clock signal.

5. A frequency standard generator as defined in claim 1, wherein said voltage controlled crystal oscillator includes a temperature oven which maintains a temperature of said crystal oscillator constant and a temperature sensor to monitor said temperature.

6. A frequency standard generator as defined in claim 1, wherein said frequency control processor dynamically determines parameters for said phase lock loop including a loop bandwidth of said phase lock loop based on a deviation of said phase difference measured by said time interval measuring circuit.

7. A frequency standard generator as defined in claim 6, wherein said parameters for said phase lock loop is determined at each step the repetition rate of which is substantially smaller than that of said satellite time signal.

8. A frequency standard generator as defined in claim 1, wherein said frequency control processor includes:

an estimation computing circuit for dividing a repetition rate of said satellite time signal into a substantially smaller repetition rate so that said phase lock loop is controlled by a substantially shorter time than a period of said satellite time signal, said estimation computing circuit generating data corresponding to said divided repetition rate showing a deviation of said phase difference between said satellite time signal and said crystal time signal; and a parameter calculator which dynamically determines parameters for said phase lock loop including a proportional constant and an integration constant of said phase lock loop on the basis of said data from said estimation computing circuit.

9. A frequency standard generator as defined in claim 8, further includes:

a buffer memory to store said digital data from said time interval measuring circuit for signal processing by said estimation computing circuit; and an adder to add said integration constant and said proportional constant formed by said parameter calculator to supply to said D/A converter.

10. A frequency standard generator as defined in claim 8, wherein said estimation computation circuit performs an arithmetic process to obtain a deviation between a present moving average value of said phase difference and an old moving average value of said phase difference.

11. A frequency standard generator as defined in claim 1, wherein said frequency control processor dynamically determines parameters for said phase lock loop each set of which is predetermined in each mode of several control modes which are classified based on a value of deviation of said phase difference measured by said time interval measuring circuit.

12. A frequency standard generator as defined in claim 11, wherein said parameters in said control mode includes a proportional constant and an integration constant of said phase lock loop.

13. A frequency standard generator as defined in claim 5, wherein said frequency control processor includes a buffer memory to store temperature data from said temperature sensor and a temperature compensation part for generating a control voltage to compensate a frequency change caused by a temperature change is said voltage controlled crystal oscillator.

14. A frequency standard generator as defined in claim 1, further includes a frequency converter which receives said output signal of said voltage controlled crystal oscillator and converts its frequency to meet the requirement of a communication network.

15. A frequency standard generator as defined in claim 14, wherein said frequency converter is formed of a phase lock loop having a voltage controlled oscillator, a loop filter and a phase comparator.

16. A frequency standard generator for generating an high accuracy reference frequency signal, comprising:

a voltage controlled crystal oscillator for generating high stability output signal to be used as a standard frequency signal;

a receiver which receives a communication signal and reproduces a highly accurate reference time signal to be used as a reference for said voltage controlled crystal oscillator;

a frequency divider which divides said output signal of said voltage controlled crystal oscillator by a dividing ratio arranged to generate a crystal time signal which is identical in frequency to said reference time signal;

a time interval measuring circuit which measures a time interval between said reference time signal and said crystal time signal and generates a digital signal indicating said time interval;

a frequency control processor which arithmetically determines control data based on said digital signal from said time interval measuring circuit such that said time interval maintains a constant value through an operation of a phase lock loop, said control data is a function of parameters including a variation of said time interval, an integration constant of said phase lock loop and a proportional constant of said phase lock loop, said parameters being determined at a repetition rate which is substantially smaller than a period of said reference time signal; and a D/A converter which converts said control data from said frequency control processor to an analog voltage which is used to control the output frequency of said voltage controlled crystal oscillator.

* * * * *